（12）United States Patent
Ahn et al.

(10) Patent No.: US 8,203,897 B2
(45) Date of Patent: Jun. 19, 2012

(54) SEMICONDUCTOR DEVICE CAPABLE OF SUPPRESSING A COUPLING EFFECT OF A TEST-DISABLE TRANSMISSION LINE

(75) Inventors: Jeong-Yoon Ahn, Kyoungki-do (KR); Ji-Eun Jang, Kyoungki-do (KR); Young-Jun Ku, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/229,086

(22) Filed: Sep. 9, 2011

(65) Prior Publication Data

US 2012/0001175 A1   Jan. 5, 2012

Related U.S. Application Data

(62) Division of application No. 12/134,865, filed on Jun. 6, 2008, now Pat. No. 8,036,053.

(30) Foreign Application Priority Data

Nov. 2, 2007   (KR) .................. 10-2007-0111351

(51) Int. Cl.
*G11C 29/00* (2006.01)
(52) U.S. Cl. ........ 365/201; 365/200; 365/206; 365/198; 365/191
(58) Field of Classification Search .................. 365/201, 365/200, 198, 191, 206; 714/718
See application file for complete search history.

(56) References Cited

U.S. PATENT DOCUMENTS 8,036,053 B2 * 10/2011 Ahn et al. .................... 365/201

* cited by examiner

*Primary Examiner* — Andrew Q Tran
(74) *Attorney, Agent, or Firm* — IP & T Group LLP

(57) ABSTRACT

Semiconductor device and semiconductor memory device include a plurality of internal circuits configured to perform test operations in response to their respective test mode signals and a plurality of test-mode control units configured to control the test operations of the internal circuits to be disabled in response to a test-off signal.

3 Claims, 4 Drawing Sheets

SEMICONDUCTOR DEVICE CAPABLE OF SUPPRESSING A COUPLING EFFECT OF A TEST-DISABLE TRANSMISSION LINE

CROSS-REFERENCES TO RELATED APPLICATIONS

This application is a division of U.S. patent application Ser. No. 12/134,865 filed on Jun. 6, 2008, now U.S. Pat. No. 8,036,053 which claims priority of Korean patent application number 10-2007-0111351 filed on Nov. 2, 2007. The disclosure of each of the foregoing applications is incorporated herein by reference in its entirety.

BACKGROUND OF THE INVENTION

The present invention relates to a semiconductor device and a semiconductor memory device, and more particularly, to technology for preventing a semiconductor device from malfunctioning due to a capacitive coupling between lines, where the lines are used for transmitting test mode signals.

With technology developments, fabrication of a semiconductor memory device has improved to enable the production of such devices with elements of smaller and smaller size for high integration.

With improvements in the fabrication process, chip sizes have decreased, allowing more and more metal lines to be disposed in a given space. As more and more metal lines are disposed in a given space, the effect of a capacitive coupling (i.e., a capacitive effect as if discrete capacitors were present between the metal lines) increases. A variety of signals and data are affected by noise due to such coupling capacitors. Thus, a method for reducing this effect is useful.

FIG. 1 is a diagram illustrating transmission lines for test mode signals disposed between global data input/output (I/O) lines in order to reduce a capacitive coupling between the global data I/O lines.

Referring to FIG. 1, when toggle signal lines such as global data I/O lines GIO0, GIO2 and GIO3 are disposed adjacent to each other, they are significantly subject to interference due to a capacitive coupling. Thus, supply voltage (VDD) lines (not illustrated in FIG. 1) or ground voltage (VSS) lines (not illustrated in FIG. 1) are disposed between the global data I/O lines GIO1, GIO2 and GIO3 in order to prevent or reduce a capacitive coupling effect between the global data I/O lines GIO1, GIO2 and GIO3.

However, since the number of power lines such as VDD lines or VSS lines is limited, disposing a sufficient number of power lines between the global data I/O lines GIO1, GIO2 and GIO3 is relatively difficult. Thus, as illustrated in FIG. 1, transmission lines for DC signals such as test mode signals TM_A and TM_B are disposed between the global data I/O lines GIO1, GIO2 and GIO3.

Here, the test mode signals TM_A and TM_B are level signals. In general, the test mode signals TM_A and TM_B are at a 'High' level in a test mode and at a 'Low' level in a non-test mode. Thus, in designing a memory device, the transmission lines for the test mode signals TM_A and TM_B having the same level as the ground voltage (VSS) are disposed between the global data I/O lines GIO1, GIO2 and GIO3 in a normal case (that is, a non-test mode) in order to prevent a capacitive coupling effect between the global data I/O lines GIO1, GIO2 and GIO3.

FIG. 2 is a diagram illustrating a problem that occurs when the transmission lines for the test mode signals TM_A and TM_B are disposed between the global data I/O lines GIO1, GIO2 and GIO3.

Referring to FIG. 2, when data of the global data I/O lines GIO1, GIO2 and GIO3 around the transmission lines for the test mode signals TM_A and TM_B change from 'Low' to 'High' level, the test mode signals TM_A and TM_B also change from 'Low' to 'High' level due to a capacitive coupling effect between the global data I/O lines GIO1, GIO2 and GIO3. Thus, internal circuits receiving the test mode signals TM_A and TM_B may enter into a test mode unintentionally.

The internal circuits receiving the test mode signals TM_A and TM_B have a test mode and a normal mode (i.e., a normal operation mode not being the test mode). Normal operations are performed in the normal mode, whereas test operations different from the normal operations are performed in the test mode with a change in an operation frequency or a voltage level. Thus, when the internal circuits enter into the test mode due to the capacitive coupling effect during a normal operation, the memory device cannot perform the normal operation, which causes a failure in data read/write operations.

FIG. 3 is a diagram illustrating another problem that occurs when the transmission lines for the test mode signals TM_A and TM_B are disposed between the global data I/O lines GIO1, GIO2 and GIO3.

Referring to FIG. 3, the data of the global data I/O lines GIO1, GIO2 and GIO3 rise to a 'High' level at the time when the internal circuits are to exit the test mode while the test mode signals TM_A and TM_B drop to a 'Low' level. In this case, the test mode signals TM_A and TM_B drop slightly from a 'High' level, rise slightly toward the 'High' level, and then drop toward the 'Low' level. Thus, there is a delay for the test mode signals TM_A and TM_B in dropping from the 'High' level to the 'Low' level. This delay time changes the entry time from the test mode into the normal mode, thus causing another malfunction.

As described above, when the transmission lines for the test mode signals TM_A and TM_B are disposed between the global data I/O lines GIO1, GIO2 and GIO3, the capacitive coupling effect between the global data I/O lines GIO1, GIO2 and GIO3 may be reduced. However, the memory device may still malfunction due to an unintentional entry into the test mode or a delay in entering the normal mode.

SUMMARY OF THE INVENTION

Embodiments of the present invention are directed to providing semiconductor memory devices and semiconductor devices that can operate stably even when test mode signals are affected by a capacitive coupling effect that occurs due to, for example, the arrangement of lines.

In accordance with an aspect of the invention, internal circuits are configured to perform test operations in response to their respective test mode signals and test-mode control units are configured to control the test operations of the internal circuits to be disabled in response to a test-off signal.

In accordance with another aspect of the invention, transmission lines are disposed between data input/output lines to transmit test mode signals, internal circuits are configured to perform test operations in response to the corresponding test mode signals received through the transmission lines, an off-signal transmission line is disposed to have less capacitive coupling effect than the transmission lines disposed between the input/output lines, that is, signals induced therein due to parasitic capacitance coupling would tend to be smaller in magnitude than signals that would be induced in the transmission lines, and test-mode control units are configured to control the test operations of the internal circuits to be disabled in response to a test-off signal received through the off-signal transmission line.

DESCRIPTION OF SPECIFIC EMBODIMENTS

Hereinafter, a semiconductor device and a semiconductor memory device in accordance with the present invention will be described in detail with reference to the accompanying drawings.

Figure 1:
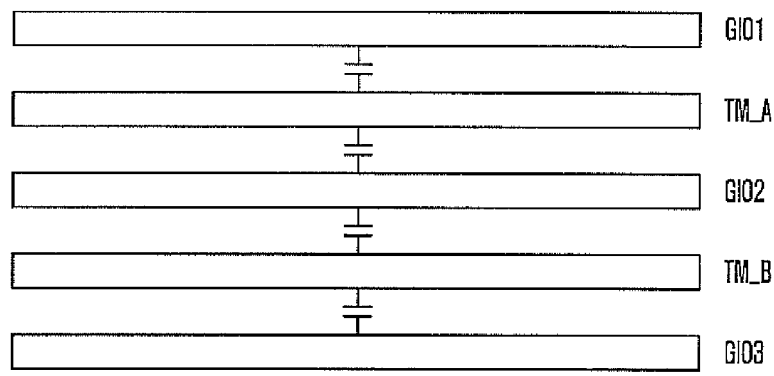
FIG. 1 is a diagram illustrating that transmission lines for test mode signals are disposed between global data I/O lines in order to reduce a capacitive coupling effect between the global data I/O lines.
Figure 2:
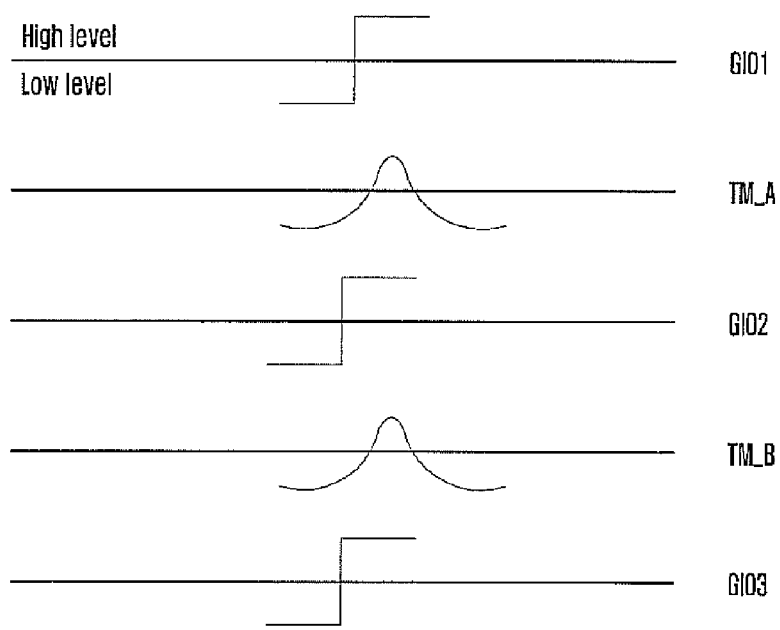
FIG. 2 is a diagram illustrating a problem that occurs when transmission lines for test mode signals TM_A and TM_B are disposed between global data I/O lines GIO1, GIO2 and GIO3.
Figure 3:
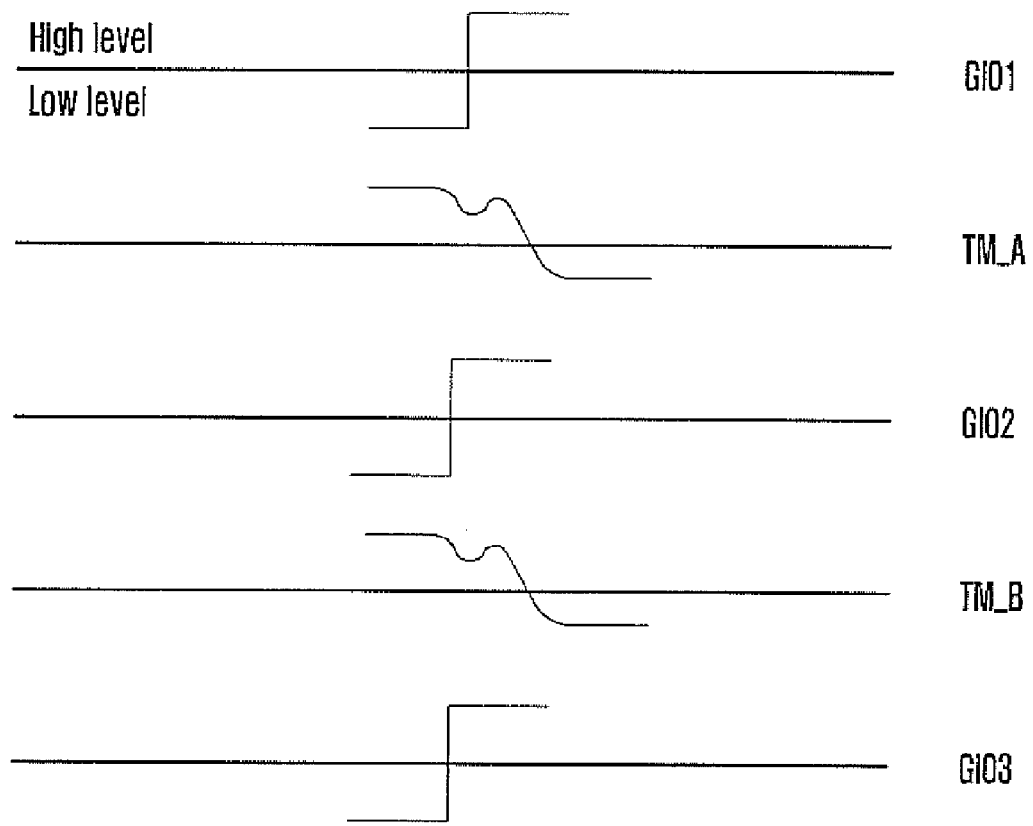
FIG. 3 is a diagram illustrating another problem that occurs when the transmission lines for the test mode signals TM_A and TM_B are disposed between the global data I/O lines GIO1, GIO2 and GIO3.
Figure 4:
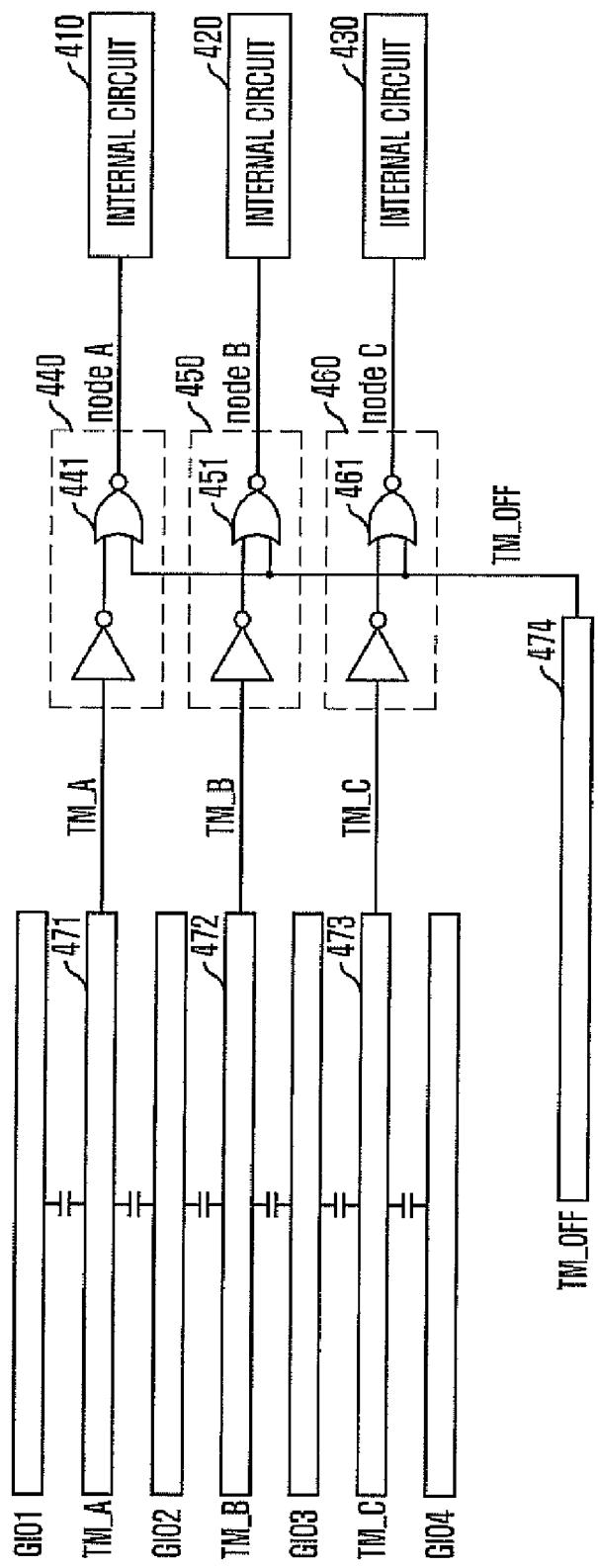
FIG. 4 is a block diagram of a semiconductor memory device in accordance with an embodiment of the present invention.

FIG. 4 is a block diagram of a semiconductor memory device in accordance with an embodiment of the invention.

Referring to FIG. 4, a semiconductor memory device in accordance with the invention includes internal circuits 410, 420 and 430 configured to perform test operations in response to their respective test mode signals TM_A, TM_B and TM_C; and test-mode control units 440, 450 and 460 configured to control the test operations of the internal circuits 410, 420 and 430 to be disabled in response to a (common) test-off signal TM_OFF.

The internal circuits 410, 420 and 430 represent various circuits in the semiconductor memory device. Examples of the internal circuits 410, 420 and 430 include an internal voltage generating circuit, a data input/output (I/O) circuit and a clock generating circuit. When the test mode signals TM_A, TM_B and TM_C are deactivated, the internal circuits 410, 420 and 430 perform normal operations. On the other hand, when the test mode signals TM_A, TM_B and TM_C are activated, the internal circuits 410, 420 and 430 enter into a test mode to perform test operations other than the normal operations. For example, the internal circuits 410, 420 and 430 perform test operations, such as generating an internal voltage with a different level or operating at a different frequency than in the normal operations.

When the test-off signal TM_OFF is activated, the test-mode control units 440, 450 and 460 disable the test operations of the internal circuits 410, 420 and 430 regardless of the logic levels of the test mode signals TM_A, TM_B and TM_C. That is, when the test-off signal TM_OFF is activated, the test mode signals TM_A, TM_B and TM_C are not transmitted to the internal circuits 410, 420 and 430 and the test operations of the internal circuits 410, 420 and 430 are deactivated. Thus, it is preferable that the test-off units 440, 450 and 460 are respectively disposed adjacent to the internal circuits 410, 420 and 430.

As illustrated in FIG. 4, the test-mode control unit 440 may include a NOR gate 441 for NORing the test-off signal TM_OFF and the test mode signal TM_A, the test-mode control unit 450 may include a NOR gate 451 for NORing the test-off signal TM_OFF and the test mode signal TM_B, and the test-mode control unit 460 may include a NOR gate 461 for NORing the test-off signal TM_OFF and the test mode signal TM_C. When the test-off signal TM_OFF is deactivated, the NOR gates 441, 451 and 461 respectively output the test mode signals TM_A, TM_B and TM_C as they are. On the other hand, when the test-off signal TM_OFF is activated, the NOR gates 441, 451 and 461 output logic 'Low' signals regardless of the logic levels of the test mode signals TM_A, TM_B and TM_C, thereby enabling the internal circuits 410, 420 and 430 to enter a normal mode state.

As illustrated in FIG. 4, since the test mode signals TM_A TM_B and TM_C are transmitted respectively through transmission lines 471, 472 and 473 disposed between global data I/O lines GIO1, GIO2, GIO3 and GIO4, the test mode signals TM_A, TM_B and TM_C are more affected by a capacitive coupling effect between the global data I/O lines GIO1, GIO2, GIO3 and GIO4. Here, it is preferable that an off-signal transmission line 474 for transmitting the test-off signal TM_OFF is disposed to be less subject to the capacitive coupling effect. Thus, the internal circuits 410, 420 and 430 are prevented from entering into the test mode according to the test-off signal TM_OFF despite the test mode signals TM_A, TM_B and TM_C being subjected to the capacitive coupling effect. More specifically, the off-signal transmission line 474, through which the test-off signal TM_OFF is transmitted, is disposed to be distant from other transmission lines and thus, is less subject to the capacitive coupling effect.

Thus, the capacitive coupling effect on the transmission lines 471, 472 and 473 for the test mode signals TM_A, TM_B and TM_C does not cause malfunctioning of internal circuits. Here, the capacitive coupling effect on the off-signal transmission line 474 (i.e., the transmission line for the test-off signal TM_OFF) is a significant design consideration.

The semiconductor memory device may be designed such that the test-off signal TM_OFF is externally received from the outside of a chip of the semiconductor memory device. Alternatively, the test-off signal TM_OFF may be generated by using MRS setting or a cut or uncut state of a fuse circuit. Since it is apparent to a skilled artisan how to generate or input the test-off signal TM_OFF, a detailed description thereof is omitted.

The above-described embodiment and the drawings is directed to an application of the embodiment to a semiconductor memory device. However, any reasonably suitable general semiconductor device may also use features of the exemplary embodiment. For instance, a general semiconductor device having a test mode thereof and a capacitive coupling problem with respect to a test mode signal for controlling the test mode such as semiconductor devices that are fabricated through a high integration process may use the exemplary embodiment of the present invention.

A semiconductor device in accordance with the invention may include transmission lines (corresponding to the reference numerals 471, 472 and 473 in FIG. 4) that are subjected to a capacitive coupling effect; internal circuits (corresponding to the reference numerals 410, 420 and 430 in FIG. 4) that perform test operations in response to their respective test mode signals TM_A, TM_B and TM_C in FIG. 4 received through the transmission lines; an off-signal transmission line (corresponding to the reference numeral 474 in FIG. 4) that is disposed to be less subject to the capacitive coupling effect; and test-off units (corresponding to the reference numerals 440, 450 and 460 in FIG. 4) that control the test operations of the internal circuits to be disabled in response to a test-off signal (corresponding to the reference symbol TM_OFF in FIG. 4), where the test-off signal is received through the off-signal transmission line.

When the test-off signal is deactivated, the internal circuits maintain a normal mode regardless of the logic levels of the test mode signals. Thus, when the logic levels of the test mode signals change due to the capacitive coupling effect, the internal circuits do not generate a malfunction by inadvertently entering the test mode. Of course, the test-off units may be configured in the same way as the test-off units 440, 450 and 460 illustrated in FIG. 4.

By using the test-off signal (TM_OFF), only the capacitive coupling effect on the off-signal transmission line affect the turning off of the test mode (e.g., to dispose the off-signal transmission line to be distant from, for example, a clock transmission line that may cause the capacitive coupling effect) regardless of the capacitive coupling effect on the transmission lines for the test mode signals (TM_A, TM_B and TM_C). The basic principle applied to the semiconductor memory device described above also applies to the general semiconductor device, and thus its detailed description is omitted.

Figure 5:
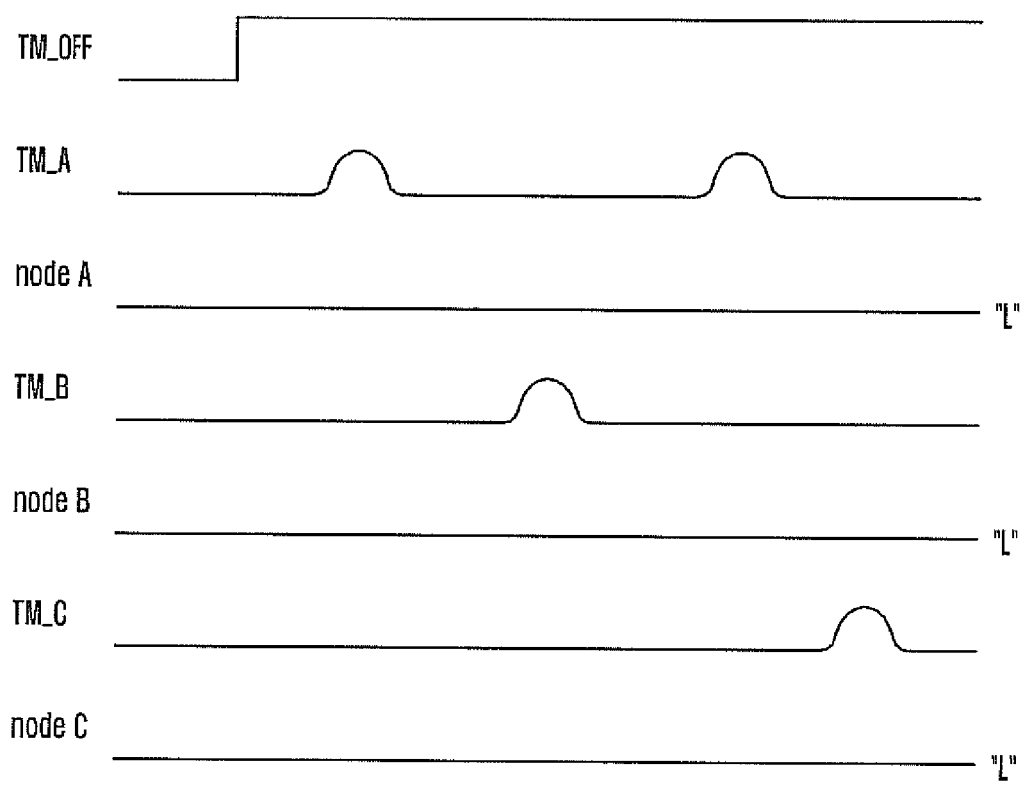
FIG. 5 is a diagram illustrating an effect that is obtained by activating a test-off signal TM_OFF in a normal operation.

FIG. 5 is a diagram illustrating an effect that is obtained by activating the test-off signal TM_OFF in the normal operation.

As illustrated in FIG. 5, when the test-off signal TM_OFF is activated in the normal operation, the output nodes (node A, node B and node C) of the test-mode control units 440, 450 and 460 maintain a logic 'Low' level even when the logic levels of the test mode signals TM_A, TM_B and TM_C fluctuate due to the capacitive coupling effect. Thus, the internal circuits 410, 420 and 430 do not malfunction by entering the test mode due to the capacitive coupling effect caused during a normal operation.

That is, the invention activates the test-off signal TM_OFF during the normal operation to prevent malfunctioning of the internal circuits 410, 420 and 430 due to the capacitive coupling effect.

As described above, the invention activates the test-off signal during the normal operation, thereby enabling the internal circuits to enter a normal mode regardless of the logic levels of the test mode signals.

Therefore, the internal circuits of the semiconductor device can perform a stable operation without entering into the test mode even when the logic levels of the test mode signals change due to, for example, the capacitive coupling effect.

While the invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a plurality of test mode control units;
   a plurality of test mode signal transmission lines interlaced between data input/output lines and coupled to the plurality of test mode control units, wherein the plurality of test mode signal transmission lines are configured to transmit respective test-mode signals to respective ones of the plurality of test mode control units;
   a plurality of internal circuits configured to perform test operations or normal operations by controlling respective ones of the plurality of test mode control units; and
   a test-off signal transmission line configured to transmit test-off signals to respective ones of the plurality of test mode control units, the plurality of test mode control units configured to control the test operations of respective ones of the plurality of internal circuits to be disabled in response to a test-off signal received through the test-off signal transmission line;
   wherein, in response to the test-off signal being activated, the plurality of test mode control units disable the test operations of respective ones of the plurality of internal circuits regardless of logic levels of the test mode signals.

2. The semiconductor device as recited in claim 1, wherein, in response to the test-off signal being activated, the plurality of test mode control units deactivate the test mode signals and output deactivated test mode signals to respective ones of the plurality of internal circuits.

3. The semiconductor device as recited in claim 1, wherein the test-off signal is activated in normal operations of the internal circuits to prevent the test operations of the internal circuits.

* * * * *